United States Patent [19]
Jukl et al.

[11] Patent Number: 5,786,827
[45] Date of Patent: Jul. 28, 1998

[54] SEMICONDUCTOR OPTICAL STORAGE DEVICE AND USES THEREOF

[75] Inventors: Milan F. Jukl, Neshanic Station; Norman Loren Schryer, New Providence; Masakazu Shoji, Warren, all of N.J.

[73] Assignee: Lucent Technologies Inc., Murray Hill, N.J.

[21] Appl. No.: 391,804

[22] Filed: Feb. 21, 1995

[51] Int. Cl.$^6$ .................................................. G09G 5/36
[52] U.S. Cl. .................... 345/507; 340/825.81; 345/81
[58] Field of Search ................... 437/52, 48, 40; 365/117, 95, 106, 109, 111, 112, 96; 257/314; 345/185, 81, 104, 173, 76, 507; 340/825.81; 235/380; 348/302, 308; 438/107, 158, 253

[56] References Cited

U.S. PATENT DOCUMENTS

| | | | |
|---|---|---|---|
| 3,488,636 | 1/1970 | Dyck | 340/173 |
| 4,565,712 | 1/1986 | Noguchi et al. | 427/53.1 |
| 4,680,704 | 7/1987 | Konicek et al. | 364/525 |
| 4,751,197 | 6/1988 | Wills | 437/174 |
| 4,752,820 | 6/1988 | Kuroiwa et al. | 365/108 |
| 4,795,720 | 1/1989 | Kawanabe et al. | 437/52 |
| 4,954,985 | 9/1990 | Yamazaki | 235/380 |
| 5,192,704 | 3/1993 | McDavid et al. | 437/52 |
| 5,243,452 | 9/1993 | Baur | 345/104 |
| 5,270,711 | 12/1993 | Knapp | 345/104 |
| 5,284,794 | 2/1994 | Isobe et al. | 437/173 |
| 5,332,686 | 7/1994 | Glenn | 437/52 |
| 5,430,462 | 7/1995 | Katagiri et al. | 345/104 |
| 5,446,564 | 8/1995 | Mawatari et al. | 345/104 |
| 5,463,216 | 10/1995 | Van Berkel | 250/208.1 |
| 5,554,869 | 9/1996 | Chang | 257/316 |

*Primary Examiner*—Richard Hjerpe
*Assistant Examiner*—Lun-Yi Lao

[57] ABSTRACT

A semiconductor memory device contains graphic information which is viewable both by direct, visual observation of the memory and electrically, e.g., via a TV screen. The device contains a semiconductor chip having a surface and an array of electrically addressable memory cells therewithin. A photograph is made on the chip for storing graphic information projected onto the chip. The photograph comprises pixels which themselves comprise variable value circuit elements of the cells, or which are optically coupled to cell circuit elements for controlling the values thereof in correspondence with the optical characteristics of the pixels. The circuit elements determine the memory content of the cells in correspondence with the graphic information stored in the photograph.

15 Claims, 5 Drawing Sheets

SEMICONDUCTOR OPTICAL STORAGE DEVICE AND USES THEREOF

BACKGROUND OF THE INVENTION

This invention relates to semiconductor storage devices, and particularly to semiconductor memory devices for direct storage of graphic information which can be read from the devices both optically and electronically.

Electronic data storage devices, e.g., semiconductor random access and read-only memories, are well known. Typically, such memories comprise a two-dimensional array of memory cells, e.g., disposed in rows and columns, and means for individually electrically addressing the cells for writing and reading data into and from the cells. Most commonly, the data written into the memory cells is encoded data in the form of electrical pulses applied to electrical terminals of each cell for changing an electrical characteristic of the cell in accordance with the data being stored.

It is also known, as disclosed in U.S. Pat. Nos. 3,488,636 (Dyck) and 4,565,712 (Noguchi et al), the subject matter of which is incorporated herein by reference, to change an electrical characteristic of memory cells for storing encoded data therein using optical rather than electrical programming means.

In Dyck, each memory cell includes a photodiode, the electrical resistance of which is a function of the intensity of light falling thereon. For writing data into each cell, a bright light is directed towards the array of memory cells, and an opaque mask is disposed between the light and the cells. The mask is provided with an array of small apertures therethrough in accordance with data to be written. Accordingly, only selected photodiodes, in accordance with the data being written, are illuminated.

Noguchi et al provide a similar arrangement except that each memory cell includes a resistor element the value of which is permanently altered upon being illuminated by a laser beam. Encoded data is written into the memory cells using an encoded opaque mask, as in Dyck, or by means of a scanning laser beam which is turned on or off under computer control.

In both patents, the stored, encoded data is read out electrically, e.g., by sequential addressing of the memory cells for determining the electrical characteristics thereof.

It occurred to the inventors herein that it would be advantageous to be able to write original (i.e., non-encoded) graphic information directly onto a semiconductor memory, and to be able to read out the stored data both electrically and optically. Such a memory is useful because the stored graphic information can be read by inserting the semiconductor memory into an electronic readout circuit connected, for example, to a TV screen, and/or by inserting the memory into an optical slide-like projector device for projecting the graphic information directly onto a screen or the like. Depending upon the size of the memory device, the graphic information stored thereon is directly visible by the naked eye and the memory device would be useful, for example, as a personal identification card.

SUMMARY OF THE INVENTION

A semiconductor memory device comprises a semiconductor chip having an externally viewable surface and an array of electrically addressable memory cells within the chip. Each cell includes a variable circuit element for controlling a data bit stored therein. The viewable surface contains an image of data stored within the cells, with pixels of the image comprising the cell circuit elements or being optically coupled to the circuit elements for controlling the values thereof.

In one embodiment, image pixels comprising the circuit elements comprise fuses which are either open or closed, thus determining both the optical characteristics of the pixels and the electrical characteristics of the circuit elements.

A method of writing data into this embodiment includes use of a layer of a photoresist overlying an array of closed fuse elements and photographically capturing an image to be stored in the photoresist layer. After exposure and developing, the photoresist layer is used as an etchant mask for opening selected fuses in accordance with the captured image.

In a second embodiment, image pixels comprising circuit elements comprise shaped layers of electrically resistive material, the shapes of which determine both the optical and electrical characteristics of the pixel-circuit elements. A method of writing data is similar to that above-described.

In a modification of the foregoing described second embodiment, the electrically resistive material is silicon, and the electrical characteristics are additionally modified by selective doping, e.g., by ion implantation, of the silicon layers.

In a third embodiment, the image pixels are part of a variable transparency photograph of the image being stored and the circuit elements comprise an array of photoconductive elements overlaid by the transparency. In use, light is flooded onto the transparency and the light passing therethrough, in accordance with the photograph image, correspondingly varies the electrical resistance of the photoconductive elements, thereby writing data into the memory in direct correspondence with the photograph image.

In a fourth embodiment, the externally viewable surface is suitable for direct writing thereon, e.g., by an ink brush, and the surface includes a plurality of spaced apart, point electrical contacts electrically connected to respective memory cells. Using an electrically conductive ink, graphic data is written directly onto the surface and stored in the memory cells via electrical connections made by the ink lines. Preferably, the surface of the semiconductor chip is as large as possible. Large area is also obtainable by mosaics of edge connected chips or by the use of thin film transistors formed in thin films of polycrystalline silicon deposited on large glass substrates.

In those embodiments where the written data is not permanently stored, e.g., in the above-described fourth embodiment using conductive ink, interaction can be provided between the displayed information and the information being written. Additionally, by storing preselected data in the memory, preselected images, e.g., blank forms, can be displayed electronically, and relevant data can be written onto the forms for immediate display and temporary or permanent storage in the memory device. This is also convenient for filling forms by hand for automatic electronic transmission to a remote location.

As previously noted, the stored information can be read both electrically and optically, e.g., using known electrical scanning and signal processing techniques for displaying the electrically stored information on a TV monitor or the like, and using known optical projector systems for projecting the optically stored information directly onto a screen.

DESCRIPTION OF PREFERRED EMBODIMENTS

Figure 1:
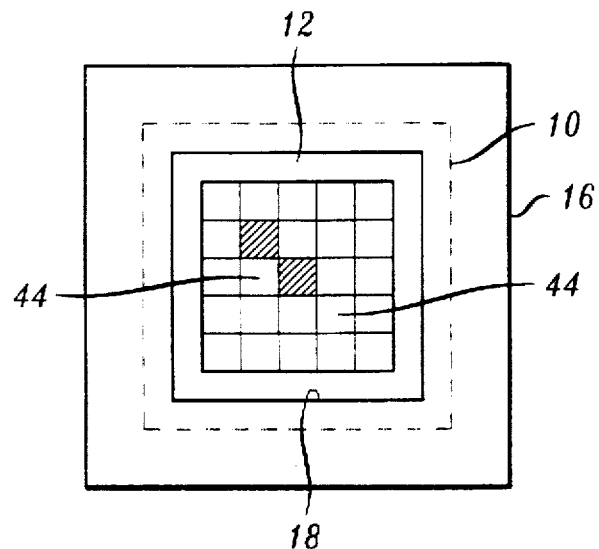
FIG. 1 is a plan view of an optical storage device in accordance with this invention.

Among other things, the inventive device is a conventional semiconductor memory disposed within a semiconductor chip, and various known semiconductor memory arrangements, such as shown in the afore-cited patents to Dyck and Noguchi et al. can be used. In general, such memories comprise a two-dimensional array of memory cells, e.g., disposed in rows and columns, and means for individually addressing the cells. Typically, the array of cells is located beneath a central surface portion of a semiconductor chip, and addressing circuits are disposed along edges of the chip. Such typical arrangement is well suited for use in the present invention. FIG. 1 shows such a typical semiconductor memory chip 10 having a surface 12 mounted within a package 16 having a window 18 allowing external viewing of the surface 12. Packages of the type shown including optical windows are known and used, for example, in known semiconductor optical sensors and electrically-writable, ultraviolet light erasable memories.

Figure 2:
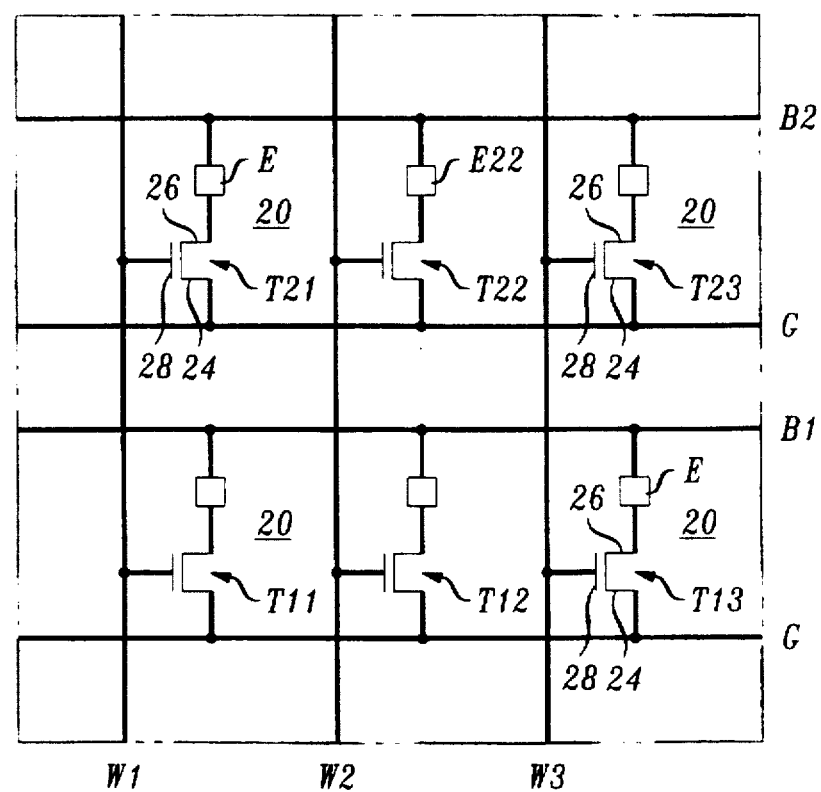
FIG. 2 is a schematic circuit diagram illustrating a matrix array of memory cells forming a storage device according to this invention.

An example of an array of cells 20 within a semiconductor chip is shown in FIG. 2.

Each cell 20 comprises a switching transistor T comprising, in this example, an MOS transistor having a source electrode 24, a drain electrode 26 and a gate electrode 28. Each transistor T is disposed at an intersection of a matrix of bit lines $B_N$ and word lines $W_N$ (where N is the index of successive bit and word lines), and each transistor is labeled in FIG. 2 indicating its connection to the various bit and word lines. Transistor $T_{13}$, for example, is connected between bit line B1 and word line W3.

The matrix includes a plurality of ground lines G, always at the same potential, and the drain electrode 26 of each transistor T is connected to a corresponding bit line $B_N$ by an electrical element E. The source electrode 24 of each transistor is connected to a ground line G, and the gate electrode 28 is connected to a corresponding word line $W_N$. Alternatively, the electrical element E can be connected between the source of the transistor and a ground line G depending upon how the invention is to be used.

The illustrated array of cells is addressed by known switching circuits, not illustrated. Thus, for addressing the cell 20 including transistor $T_{13}$, a voltage is applied to bit line B1 and a voltage is applied to word line W3. The voltages are appropriate for turning on the transistor $T_{13}$ and for causing flow of current therethrough depending upon the condition of the electrical element E. If the elements E are, for example, fuses which are either open (blown) or closed (intact), current will flow through transistor $T_{13}$ between bit line 1 and the corresponding ground line G depending upon the state of the element E. If open, no current will flow. Monitoring such current flow is a means for reading data stored in the memory cell. Writing data into the cell in this embodiment involves opening or leaving intact the element E.

Figure 3:
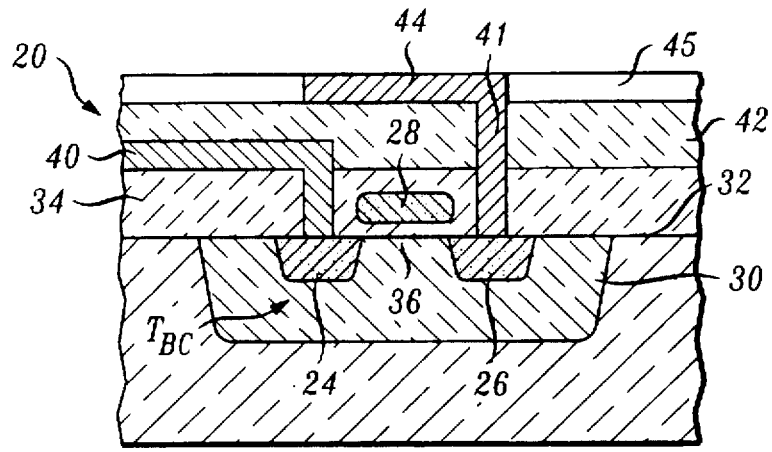
FIG. 3 is a cross-sectional view showing one example of a memory cell in accordance with this invention.

FIG. 3 shows a single memory cell disposed within a semiconductor chip of silicon. As is conventional, the cell comprises two doped regions 24 and 26 (of $N^+$ conductivity in this example) spaced apart within a region 30 of P-type conductivity. The two regions 24 and 26 are disposed at a surface 32 of the chip which is covered by an insulating layer 34 of silicon dioxide. Disposed over the space 36 between the two regions 24 and 26, and spaced from the surface 32 by a thin portion of the insulator layer 34, is a gate electrode 28. The two regions 24 and 26 comprise source and drain regions of an MOS transistor having a gate electrode 28.

An electrical connection to the source region 24 is by means of a conductive line 40 which extends through the layer 34. A similar connection (not shown) is provided for the gate electrode 28. Disposed over the layer 34 and the electrical conductors thereon is a second insulating layer 42 of silicon dioxide. Disposed on this layer 42 is a layer 44 of fusible material, e.g., aluminum. The layer 44 is connected, at one end, to the drain electrode 26 of the transistor via a connector 41 and, at its other end, to a bit line 45 shown behind the fusible material 44.

As previously noted, FIG. 1 shows, schematically, a plan view of a semiconductor memory chip including memory cells as illustrated in FIGS. 2 and 3. A central region comprises a plurality of closely spaced but electrically separate fuses 44 of the type shown in FIG. 3, with each fuse 44 directly overlying and being connected to a corresponding memory cell. All of the fuses are exposed at the chip surface, hence the fuses can be selectively blown for writing data into the memory array.

To the point so far described, the memory device is of known type, and the fuses can be selectively blown by means of a scanning laser beam as disclosed in the afore-cited patent to Noguchi et al.

Alternatively, instead of fuses, the electrical elements E (FIG. 2) can be photodetectors which are selectively controlled (turned on or off) by selective illumination through an apertured plate as disclosed in the aforecited patent to Dyck. In the Dyck arrangement, writing and reading occur simultaneously.

In the cited prior art devices, encoded data is written into the memory devices and there is no disclosure or suggestion that the physical appearance of the device, after data is written thereon, is of any significance.

Conversely, in accordance with this invention, graphic, non-encoded, analog data is written directly into the memory device, and the graphic information is also graphically stored on the device for visual read-out, e.g., similarly as a photograph readable by the naked eye.

Figure 4:
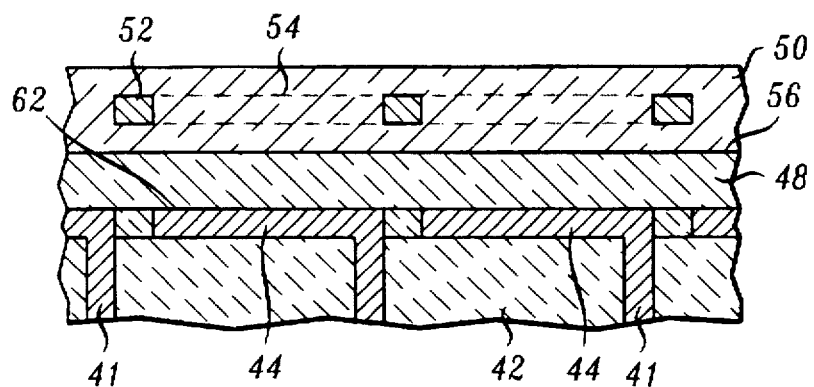
FIG. 4 is a view similar to FIG. 3 but showing only upper portions of two adjacent memory cells.

FIG. 4 shows an embodiment of the invention suitable for writing graphic information onto and into a memory device of the type shown in FIG. 3, i.e., including fusible electrical elements E. In this embodiment, the upper surface of all the fuses 44 shown in FIG. 3 is coated with a continuous layer 48 of a known photoresist material of a type commonly used in the semiconductor device industry. FIG. 4 also shows a layer 50 of a transparent photomask material, e.g., glass, covering the layer 48, and a layer 52 of opaque material, e.g., chrome, embedded within the photomask layer 50 and having a pattern of apertures 54 therethrough, with each aperture directly overlying a respective fuse E. The apertured layer 52 serves as a shadow mask for optically isolating the individual fuses for providing discrete and separate image pixels. Both the layer 50 and the shadow mask layer 52 are optional and can be omitted.

In use of the device shown in FIG. 4, graphic data, e.g., an optical image of a typewritten page or a photograph is projected onto the surface 56 of the photoresist layer 48 by known light optical means, e.g., a known lens system identically as in a camera where the surface 56 of the layer 48 is disposed in the focal plane of the camera. Other imaging schemes, such as projection printing, can be used.

Figure 5:
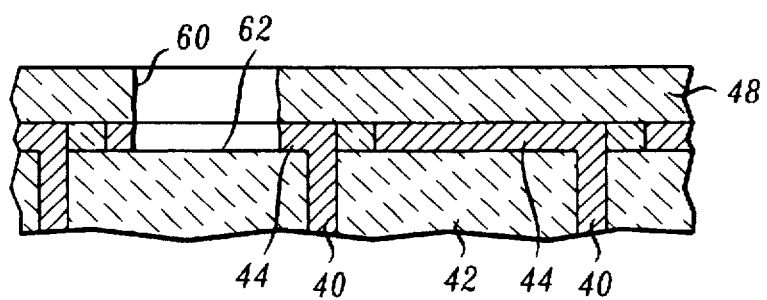
FIG. 5 shows a portion of the device shown in FIG. 4 and illustrates the writing of data into the device.

The projected pattern of light (visible or UV, or the like, suitable for use with the photoresist material being used) selectively exposes the photoresist layer in correspondence with the light intensity pattern falling thereon. The shadow mask 50, 52 is then removed and the exposed photoresist layer 48 then developed and etched. After etching, a pattern of openings 60 (one of which is shown in FIG. 5) is formed through the layer 48 in correspondence to where the intensity of the light does or does not exceed a threshold level. In effect, the originally projected graphic image is photographically reproduced where the photograph pixels comprise openings through an otherwise continuous layer of the photoresist material.

The pixel openings 60 through the layer 48 selectively expose individual fuses 44 beneath the layer, and the selected fuses are thereafter etched away using a known etching process, e.g., reactive ion etching. The fuses not exposed beneath openings 60 are masked against etching and remain intact. The two-level (black and white) graphic information photographically captured in the photoresist layer 48 is thus transferred to the array of fuses.

The photoresist (etchant masking) layer 48 is then removed leaving an array of open and closed fuses reproducing the graphic information. Disposed beneath the array of fuses is the surface 62 of the layer 42 of silicon dioxide. The light reflectivity of the silicon dioxide surface 62 is significantly different from that of the aluminum fuses, hence reading of the half-tone graphic information is possible by direct visual means, e.g., viewing by the naked eye or by known slide projection means or the like.

The selectively opened and unopened fuses also program the memory cells in direct correspondence to the visually stored information. Thus, by electrically addressing the memory cells for determining the data stored therein and processing the output signals in known fashion, the stored data is electrically reproducible, e.g., on a TV screen. The electrically reproduced graphic image, in this embodiment, is substantially identical to the graphic information visibly stored on the memory device.

In another embodiment (FIGS. 6 and 7), the fusible circuit elements 44 shown in FIG. 4 are replaced by circuit elements 66 each comprising a layer 68 of an electrically resistive material, e.g., lightly doped polycrystalline silicon, overlying the silicon dioxide layers 42 and 34 (FIG. 3) overlying a corresponding memory cell. The resistive material layer 68 is of generally rectangular shape and is connected at opposite ends to elongated electrical contacts 41 and 45 which are connected in turn (FIGS. 2 and 3) to the underlying switching transistor drain region 26 and the corresponding bit line $B_N$. Preferably, for a reason hereinafter-described, the contact regions 41 and 45 are made as small as possible, e.g., covering less than 10 percent of the cell area. The plate-like elements provide, prior to information writing, an identical, relatively low electrical resistance in each cell electrical circuit. Additionally, the materials of the device are selected such that the reflectivity of the layer 68 forming the circuit element is significantly different from that of the underlying layers, that is, the two layers 42 and 34 of silicon dioxide. In the present embodiment, the polysilicon of the layer 68 has a higher reflectivity than the underlying layers of silicon dioxide owing to the high surface porosity of polysilicon and light scattering effect thereof.

As in the embodiment illustrated in FIG. 4, the array of electrically resistive circuit elements 66 is overlaid by a layer 48 (FIG. 6) of a photoresist material. Also, photoresist layer 48 is preferably overlaid with a shadow masking layer such as shown as 50–52–54 in FIG. 4.

Figure 6:
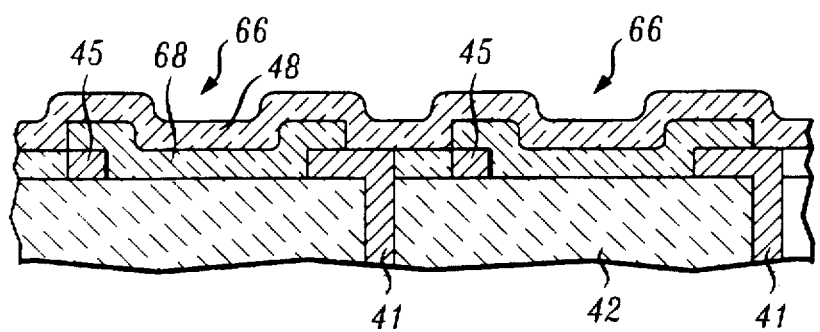
FIG. 6 is a cross-sectional view similar to FIG. 4 but omitting an upper portion thereof and showing a second example of memory cells in accordance with this invention.
Figure 7:
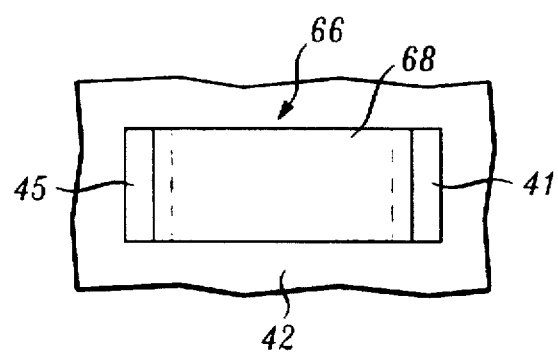
FIG. 7 is a plan view of one of the variable circuit elements shown in FIG. 6.

For writing graphic data into the device shown in FIG. 6, an optical image is projected onto the photoresist layer 48 through the shadow mask, and, after developing the layer 48, the layer 48 comprises an etchant mask overlying the array of electrically resistive circuit elements 66.

Figure 8:
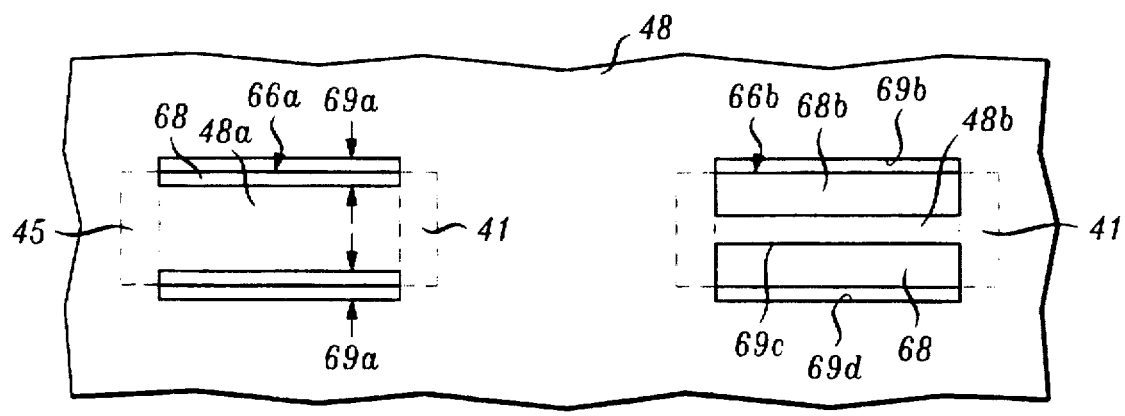
FIG. 8 is a plan view illustrating the writing of data into variable circuit elements of the type shown in FIG. 7.

A plan view of a portion of the developed and etched photomasking layer 48 is shown in FIG. 8. FIG. 8 shows two circuit elements 66a and 66b each comprising a resistive layer 68 overlaid with a rectangular strip 48a and 48b forming part of the overlying photomasking layer 48. That is, with respect to each circuit element 66a and 66b, a pair of openings 69a and 69b is provided through the layer 48 partially exposing the surfaces of the underlying resistive layers 68. At element 66a, the pair of openings 69a is indicated by arrows; at element 66b, side edges 69c and 69d of one opening 69b are indicated. Both pairs of openings 69a and 69b are of the same length but have different widths dependent upon the graphic information contained in corresponding pixels of the graphic information being stored. In the element 66b, for example, the central strip 48b is relatively narrow, hence the pair of openings 69b are relatively wide. The wide openings 69b expose relatively wide portions of the underlying layer 68. Conversely, in the element 66a, the central strip 48a is relatively wide and the openings 69a bare relatively narrow.

The widths of the openings 69a and 69b through the photomasking layer 48 are a function, as previously noted, of the graphic information being stored at each memory cell. For example, an image to be stored is first projected onto a half tone, sensitive image sensing device, e.g., a charge coupled device, and the light energy falling on each image pixel is determined. Then, using a computer or the like, the original image is reformed wherein each image pixel comprises a rectangle of constant length but with a width corresponding to the light energy of the original corresponding pixel. The reformatted image is then projected onto the photoresist layer 48 overlying the resistive circuit elements 66 and reproduced in the layer 48 in the form of a pattern of rectangular openings 69 of varying widths such as illustrated in FIG. 8.

Figure 9:
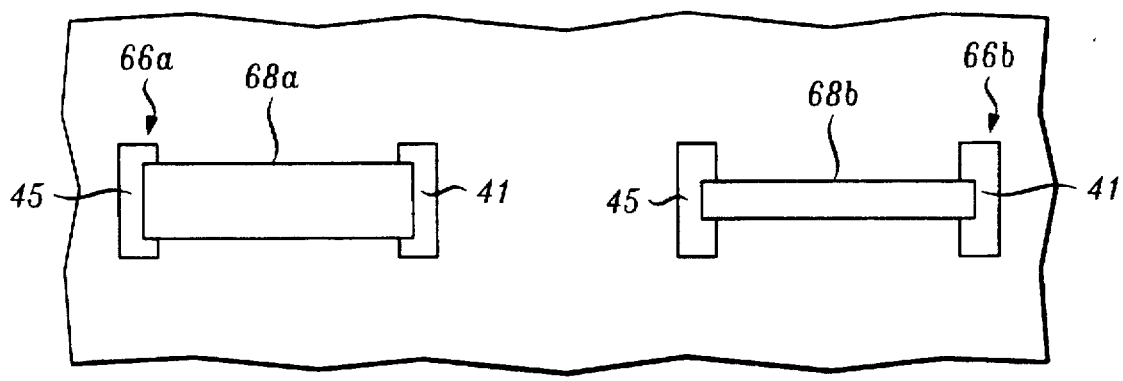
FIG. 9 is a plan view showing the variable circuit elements of FIG. 8 with stored information.

Each of the various pairs of openings in the layer 48, e.g., openings 69a and 69b in FIG. 8, expose surface portions of the underlying resistive layers 68, and the layer 48 is then used as an etchant mask for etching away the exposed layer 68 portions for reproducing the pattern of strips (e.g., strips 48a and 48b) in the layers 68. Known etching techniques, e.g., reactive ion etching, can be used for patterning the various layers 68 while not etching into the underlying layer 42 (FIG. 4) of silicon dioxide. The masking layer 48 is then removed. An illustrative result is shown in FIG. 9 which shows two resistive circuit elements 66a and 66b shaped in correspondence to the two rectangular strips 48a and 48b shown in FIG. 8.

Each of the resistive circuit elements 66a and 66b comprises a portion (68a, 68b) of the original resistive layer 68 (FIGS. 6 and 7) extending between the two underlying contacts 41 and 45. In correspondence with the openings 69a and 69b (FIG. 8) through the layer 48, the width of the remaining layer portion 68a of the resistive element 66a is only slightly reduced while the width of the layer portion 68b of the element 66b is significantly reduced. The actual resistance value of the resistance elements 66 is inversely related to the cross-sectional areas thereof, hence the resistance value of the element 66a is significantly less than that of the element 66b.

As previously described, each resistance element 66 is a circuit element E (FIG. 2) in a corresponding memory cell, hence, by virtue of the different width, different resistance value circuit elements, different information is written into the various memory cells. Because a large number of different widths and corresponding different resistance values are obtainable, each cell can store a wide range of information corresponding to different light levels at each pixel. Accordingly, multi-tone graphic data is storable in the memory circuit and is electrically readable from the memory.

Similarly, because of the difference in radiation reflectivity between the material of the layers 68 and the underlying layers 42 and 34 (FIG. 3), the amount of radiation reflected from each pixel is also a function of the width of the patterned layers 68. Accordingly, each pixel also stores multi-tone, radiant energy addressable information. Also, because the information stored both electrically and optically in each cell is a function of the same parameter, i.e., the width of the resistive layer 68, identical optical and electrical information can be stored in each cell.

Because the graphic information is optically stored as variations in the widths of the resistive plates 68, the space occupied by the contacts 41 and 45 in each pixel is wasted space. This is why the contacts 41 and 45 are made as small as possible. Alternatively, although not shown, the contacts can also be patterned in correspondence with the patterning of the plates 68, thereby making better use of the avoidable space and increasing the resolution of the stored graphics.

Figure 10:
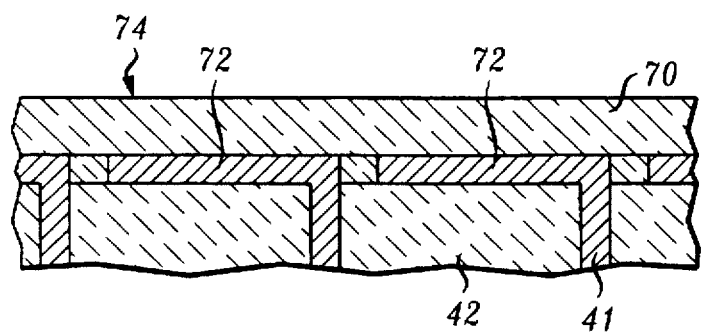
FIG. 10 is a view similar to FIG. 4 but omitting an upper portion shown in FIG. 4 and showing a third embodiment of the invention.

A different arrangement for providing multi-tone storage is shown in FIG. 10, wherein a layer 70 of a photographic emulsion, of a type, for example, identical to known black and white or color camera films, is used overlying an array of circuit elements 72 each comprising a layer of a known photoconductive material, e.g., semiconductive cadmium sulphide.

For writing graphic information into the device shown in FIG. 10, a photograph transparency of the image being stored is made in the photographic emulsion layer 70 in conventional manner. The photograph is directly viewable. For both writing the photographically stored graphic image into the underlying storage cells, and simultaneously electrically reading out the written data, the photographic transparency is flooded with suitable radiation, e.g., scattered white light, which penetrates the transparency in accordance with the varying opacity thereof. Different amounts of light thus reach the photoconductive circuit elements 72 for varying the electrical resistance values thereof in direct correspondence with the graphic information contained in the overlying photographic transparency. The resistance of the circuit elements 72 is varied only in response to the presence of the flooding light, and the device is generally read simultaneously with the writing of data therein. Conversely, capacitive or other storage elements can be provided in each cell for storing current flow at least temporarily in each cell during the writing operation whereby the electrically stored data can be read at least for a short time after termination of the flooding light.

Because the photoconductive elements 72 have variable resistance values in response to varying amounts of radiation incident thereon multi-tone information is storable.

Additionally, multi-tone, multi-chromatic (color) images can be stored by the use of known color film arrangements, e.g., multi-layer emulsions each responsive to a different range of frequencies. For electrical storage of the color image, each pixel comprises a group of three circuit elements 72 with each element of the group being covered with a respective filter passing a selected range of frequencies, e.g., one of the primary colors. Writing and reading of data is as before described except that each group of three cells is used to generate one pixel containing multi-tone and multi-chromatic information. Known technology can be used, e.g., a known color TV monitor having three electron guns under control of respective storage cells in each group of three cells to display the graphic information.

Figure 11:
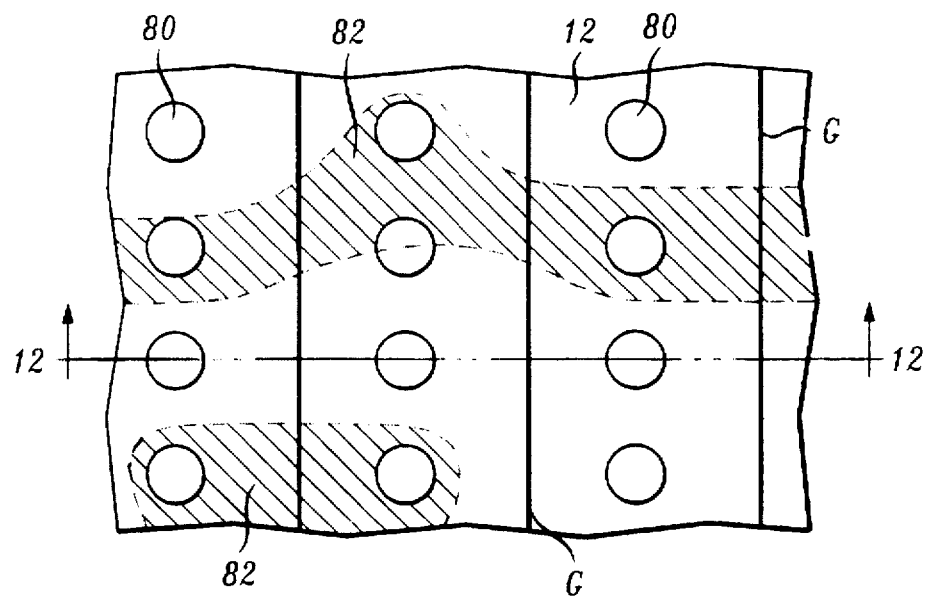
FIG. 11 is a plan view of a viewable surface portion of a device according to a fourth embodiment of the invention.
Figure 12:
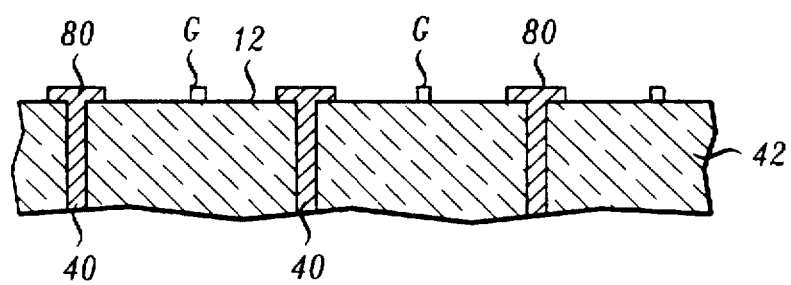
FIG. 12 is a cross-sectional view taken along line 12—12 of FIG. 11.
Figure 13:
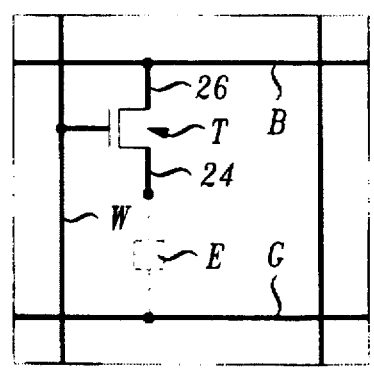
FIG. 13 is a schematic circuit diagram of a single memory cell using circuit elements of the type shown in FIGS. 11 and 12.

FIGS. 11, 12 and 13 show another embodiment of the invention. In this embodiment, the electrical conductor 40 from the source electrode 24 (rather than the conductor 41 from the drain electrode 26 as shown in FIG. 3) in each memory cell extends through the covering layer 42 and terminates thereon as an isolated electrode pad 80, for example, of circular configuration. A schematic circuit diagram for one memory cell is shown in FIG. 13. In this embodiment, the circuit element E is shown connected between the transistor T source electrode 24 and a ground line G, and, because the circuit element E may or may not be present, as hereinafter described, the element E is shown as a dashed box between the electrode pad 80 and the ground line.

The electrode pads 80 from all the cells can be disposed in various patterns on the surface 12 of the layer 42 and, by way of example, are shown in FIG. 11 as being arranged in a matrix of rows and columns (in correspondence with the underlying array of memory cells). Preferably, and as is possible with known semiconductor technology, the pads 80 are so small as to be substantially invisible. As in the previously described embodiments, the surface 12 is visible through the package window 18 (FIG. 1), but rather than projecting an image of graphic data to be stored on the surface, graphic information is literally written onto the surface as by means of a brush or pen or the like.

Also disposed on the surface 12 of the layer 42 are a plurality of ground lines G forming squares enclosing each pad (as illustrated in FIG. 11) or groups of pads. Although not shown in FIG. 11, the bit lines B and the word lines W are disposed beneath the layer 42, e.g., disposed (and electrically isolated from one another) on the surface of the layer 32 (FIG. 3) underlying the layer 42.

In use of the devices illustrated in FIGS. 11–13, various marks 82 (illustrated by dashed lines in FIG. 11) are written directly onto the surface using an electrically conductive ink, such as dissolved carbon black or fine metal particles dissolved within an organic solvent, having a reflectivity significantly different from that of the surface. The marks are optically visible on the surface 12, similarly as written text on a sheet of paper, hence the marks can be viewed either by the naked eye or by a slide-projector type device. Also, the marks can be erased, e.g., by use of an organic solvent, allowing changing of the written information.

Additionally, as shown in FIG. 11, the electrically conductive ink provides an electrical connection E (FIG. 13) between each pad 80 overlaid by an ink marking 82 and an adjoining ground line G. According, when the memory array is electrically addressed, only those memory cells electrically connected to ground conduct current, and the written image is electrically read.

A feature of the ink written device is that by scanning the memory cells one by one in sequence and at a raster scanning rate quite high in comparison with the rate at which the inked marks are written, the actual sequence of formation of the various marks can be captured in real time. That is, the actual writing sequence can be reproduced electrically on, for example, a TV screen. This is a great advantage in recognizing Chinese characters, since they are written in a fixed order.

Having described several embodiments of the invention, certain generalizations are now made.

Basically, the invention comprises writing graphic information directly into a semiconductor memory. By "directly" is meant that the information being written is not encoded, and both the information written and the information read electronically from the memory can have identical appearance and format.

The semiconductor memory can take different, presently known forms. Specifically, in addition to memory content written as herein described, the memory can be programmable for permanently or temporarily storing information, e.g., such as forms, catalogues, data and the like. Then, when the memory is read out electrically, the written information is displayed along with the graphically stored information. Interaction between the graphic information being written and previously or simultaneously written information is then possible. This facilitates graphic editing. Also, because all information stored in the memory cells is electrically accessible in the form of electrical signals, electronic processing of the stored data is readily accomplished. Thus, in addition to displaying the stored information, e.g., on a TV monitor, or electronically printing it on a sheet of paper using known faxcimile or photocopy technology, the stored information can be used to update records, provide instructions for various processes, and the like.

Another feature of the invention is that the graphically written information is also, all or in part, retained on an outside surface of the memory device for direct viewing. This provides many possible advantages including visual identification of all or part of the stored information, thereby simplifying selection of desired memory devices among numerous such devices, and allowing use of the written memory device as an identification badge which can be visually read by, say, a security guard at an outer gate as well as by a guard at a remote, more secure location.

Additionally, similarly as complementary information can be stored within the memory device, for interaction with the graphically stored information, complimentary information written electronically into the chip can be printed directly onto the device surface onto which the graphic image being stored is imaged. This can be accomplished by connecting the drain regions of selected switching transistors to bit lines via current excitable materials, e.g., electroluminescent materials, which undergo visual change upon the passage of current therethrough. Such current excitable materials can be disposed on the viewable surface similarly as, for example, are the photoconductive elements 72 shown in FIG. 10, except that, to be externally visible, the current excitable elements are not covered with the photographic emulsion layer 70 shown in FIG. 10.

What is claimed is:

1. A semiconductor memory device for storing data including a semiconductor chip having a surface optically viewable from outside said device, an array of electrically addressable, data storing memory cells within said chip for electrical reading of data stored within said cells, each of said cells including a circuit element having an electrical characteristic the value of which determines the data stored in each said cell, said surface containing a graphic image of data stored within said array of memory cells, said image comprising an array of pixels having different optical characteristics by means of which said graphic image is stored and is optically viewable independently of electrical reading of data stored within said cells, each of said pixels being operatively associated with a respective one of said circuit elements, and the electrical characteristic of each of said circuit elements being a function of the optical characteristics of the pixel associated therewith.

2. A memory device according to claim 1 wherein each of said circuit elements comprises a fuse having open and closed states determining the value of the electrical characteristic thereof, each of said fuses having different optical characteristics dependent upon the state of the fuse, said fuses forming said optically viewable surface of said device, and said fuses comprising said pixels of said optically viewable image.

3. A memory device according to claim 1 wherein each of said circuit elements comprises a plate of electrically resistive material having an optical characteristic in accordance with the shape of said plate, said plates forming said optically viewable surface and said plates comprising said pixels of said optically viewable image.

4. A memory device according to claim 3 wherein said plates are of a semiconductor material having different concentrations of dopants therein for controlling the electrical resistance of said circuit elements.

5. A method of writing data into a semiconductor memory device including a semiconductor chip having an array of electrically addressable, data storing memory cells therein for electrical reading of data stored within said cells, each of said cells including a circuit element having an electrical characteristic the value of which determines the data stored in each cell, and said chip having a surface optically viewable from outside said device, the method comprising forming and storing, on said surface, a photograph of an image projected onto said surface, the photograph comprising an array of pixels having different optical characteristics by means of which said image is optically viewable independently of electrical reading of data stored within said cells, and controlling the value of the electrical characteristics of said circuit elements in accordance with the optical characteristics of said pixels.

6. A method according to claim 5 including forming said photograph as an etchant mask overlying an array of circuit elements each comprising a first layer overlying a second layer, said first and second layers having different optical characteristics, said pixels in said etchant mask comprising apertured and non-apertured portions of said mask, and etching through said first layer of those of said circuit elements underlying apertured portions of said etchant mask for exposing said second layer of said those circuit elements.

7. A method according to claim 6 wherein said first layer is of an electrically resistive material, and etching said first layer of each of said those circuit elements for shaping said first layer in accordance with a pattern provided by a plurality of pixels overlying said first layer for controlling the resistance of said first layer.

8. A method according to claim 6 including forming said photograph over an array of circuit elements each comprising a photoconductive material sensitive to radiant energy, flooding said photograph with said radiant energy for varying the electrical resistance of said circuit elements in proportion to the intensity of energy reaching said elements through said photograph, and, simultaneously with said flooding, electrically addressing said memory array for electrically reading data corresponding to said photograph image.

9. A semiconductor memory device comprising a semiconductor chip having a surface, an array of electrically addressable data storing cells within said chip for electrical reading of data stored within said cells, each of said cells including a circuit element having a variable electrical characteristic the value of which determines the data stored in said cells, means for addressing the circuit elements for controlling the variable characteristic thereof in response to graphic information projected onto said chip, and means for storing said graphic information on said surface for direct visual reading of said information independently of electrical reading of data stored within said cells.

10. A memory device according to claim 9 wherein said circuit element addressing means comprises an etchant mask having a pattern of openings therethrough corresponding to a pattern of radiant energy intensity variations contained in graphic information projected onto said chip.

11. A semiconductor memory device for storing data including a semiconductor chip having a surface optically viewable from outside said device, an array of electrically addressable, data storing memory cells within said chip, each of said cells including a circuit element having an electrical characteristic the value of which determines the data stored in each said cell, said surface containing a graphic image of data stored within said array of memory cells, said image comprising an array of pixels having different optical characteristics by means of which said graphic image is optically viewable, each of said pixels being operatively associated with a respective one of said circuit elements, the electrical characteristic of each of said circuit elements being a function of the optical characteristics of the pixel associated therewith, said surface comprising a variable transparency photograph containing said image, and said circuit elements each comprising a photoconductive element optically coupled to a corresponding pixel of said photograph, whereby, upon flooding said photograph with radiant energy and simultaneously electrically addressing said memory cells, data corresponding to said pixels is written into said memory cells in accordance with radiant energy reaching said photoconductive elements through said photograph.

12. A semiconductor memory device for use in combination with an electrical display device, the memory device comprising a semiconductor chip including an array of electrically addressable data storing cells within said chip for electrical reading of data stored within said cells for input to an electrical display device for displaying said data as a first graphic image, said memory device having an externally viewable surface, means for storing a second graphic image on said surface for direct visual observation of said second image independently of electrical reading of data stored within said cells, and means for writing data from said second image into said array of cells whereby said first image displayed by said display device corresponds to and is derived from said second image visually observable on said memory device surface.

13. A memory according to claim 12 wherein said data from said second image is in the form of pixels having varying optical characteristics for visually displaying said data, and said pixels additionally comprising electrical components of said cells and having varying electrical characteristics for storing said data within said cells.

14. A method of writing data into a semiconductor memory device including a semiconductor chip having an array of electrically addressable data storing memory cells therein, said device having a surface optically viewable from outside said device, the method comprising the steps of first forming and storing a graphic first image on said surface for direct visual observation of said first image independently of any electrical reading of data stored within said memory cells, then transferring data from said first image for storage within said memory cells, and reading said data stored within said cells and displaying said read data on an electrical display device as a graphic second image corresponding to and derived from said first graphic image directly observable on said memory device.

15. A method according to claim 14 including forming said first image by means of pixels having varying optical characteristics in correspondence with the data contained in said first image, and said transferring data step comprises electrically interconnecting said pixels within respective cells, said pixels having varying electrical characteristics in correspondence with said optical characteristics thereof for storing said data within said cells.

* * * * *